(12) United States Patent
Takeuchi

(10) Patent No.: US 8,249,125 B2
(45) Date of Patent: Aug. 21, 2012

(54) OPTICAL DEVICE INCLUDING MULTILAYER REFLECTOR AND VERTICAL CAVITY SURFACE EMITTING LASER

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 12/792,089

(22) Filed: Jun. 2, 2010

(65) Prior Publication Data

US 2010/0272143 A1 Oct. 28, 2010

Related U.S. Application Data

(62) Division of application No. 11/782,221, filed on Jul. 24, 2007, now Pat. No. 7,756,187.

(30) Foreign Application Priority Data

Aug. 25, 2006 (JP) .................................. 2006-229100
May 24, 2007 (JP) .................................. 2007-137949

(51) Int. Cl.
*H01S 3/08* (2006.01)

(52) U.S. Cl. .................... 372/96; 372/49.01; 372/50.124

(58) Field of Classification Search ..................... 372/96, 372/49.01, 50.124
See application file for complete search history.

(56) References Cited

U.S. PATENT DOCUMENTS

| 5,244,749 | A | 9/1993 | Bean et al. |
| 5,307,395 | A | 4/1994 | Seely et al. |
| 6,720,585 | B1 | 4/2004 | Wasserbauer et al. |
| 2002/0150135 | A1* | 10/2002 | Naone et al. .................... 372/45 |
| 2003/0047744 | A1 | 3/2003 | Yanamoto |
| 2004/0042036 | A1 | 3/2004 | Kodera et al. |
| 2004/0075908 | A1 | 4/2004 | Chen et al. |

FOREIGN PATENT DOCUMENTS

| JP | 2000-091701 | 3/2000 |
| JP | 2002-214428 | 7/2002 |
| JP | 2003-107241 | 4/2003 |
| JP | 2006-190758 | 7/2006 |

OTHER PUBLICATIONS

Syuutaro, et al., "Thermal Characteristics of Modulation DBR VCSEL Structure Device", Precision and Intelligence Laboratory, Tokyo Institute, 47th Seiken Symposium, Mar. 2, 2006, pp. 80-81.

(Continued)

*Primary Examiner* — Tod T Van Roy
*Assistant Examiner* — Joshua King
(74) *Attorney, Agent, or Firm* — Fitzpatrick Cella Harper & Scinto

(57) ABSTRACT

Provided are an optical device including a multilayer reflector having a layer whose optical thickness is not λ/4, and a vertical cavity surface emitting laser using the optical device. A resonance frequency shift or a reduction in reflectivity which is caused by a deviation from an optical thickness of λ/4 can be suppressed to improve characteristics and yield. The optical device for generating light of a wavelength λ includes a reflector and an active layer. The reflector is a semiconductor multilayer reflector including a first layer and a second layer which are alternatively laminated and have different refractive indices. The first layer has an optical thickness smaller than λ/4. The second layer has an optical thickness larger than λ/4. The interface between the first layer and the second layer is located at neither a node nor an antinode of an optical intensity distribution within the reflector.

18 Claims, 19 Drawing Sheets

OTHER PUBLICATIONS

Someya, et al., "Room Temperature Lasing at Blue Wavelengths in Gallium Nitride Microcavities", vol. 285, pp. 1905-1906, Sep. 17, 1999.

Ng, et al., "High Reflectivity and Broad Bandwidth AlN/GaN Distributed Bragg Reflectors Grown by Molecular-Beam Epitaxy", Applied Physics Letters, vol. 76, No. 20, pp. 2818-2820, May 15, 2000.

* cited by examiner

FIG. 5

| STRUCTURE | RESONANCE WAVELENGTH (nm) | REFLECTANCE (%) |
|---|---|---|
| STRUCTURE (1) | 670 | 99.9970 |
| STRUCTURE (2) | 670 | 99.9973 |
| STRUCTURE (3) | 670 | 99.9970 |
| STRUCTURE (4) | 670 | 99.9974 |

FIG. 7

| STRUCTURE | RESONANCE WAVELENGTH (nm) | REFLECTANCE (%) |
|---|---|---|
| STRUCTURE (1) | 678 | 99.9800 |
| STRUCTURE (2) | 662 | 99.9886 |
| STRUCTURE (3) | 670 | 99.9969 |
| STRUCTURE (4) | 670 | 99.9974 |

FIG. 11

| STRUCTURE | RESONANCE WAVELENGTH (nm) | REFLECTANCE (%) |
|---|---|---|
| STRUCTURE (1) | 400 | 0.9946 |
| STRUCTURE (2) | 400 | 0.9953 |
| STRUCTURE (3) | 400 | 0.9948 |
| STRUCTURE (4) | 400 | 0.9912 |

FIG. 13

| STRUCTURE | RESONANCE WAVELENGTH (nm) | REFLECTANCE (%) |
|---|---|---|
| STRUCTURE (1) | 391 | 0.9840 |
| STRUCTURE (2) | 410 | 0.9830 |
| STRUCTURE (3) | 400 | 0.9953 |
| STRUCTURE (4) | 400 | 0.9912 |

OPTICAL DEVICE INCLUDING MULTILAYER REFLECTOR AND VERTICAL CAVITY SURFACE EMITTING LASER

This is a division of U.S. patent application Ser. No. 11/782,221, filed Jul. 24, 2007 now U.S. Pat. No. 7,756,187.

BACKGROUND OF THE INVENTION

1. Field of the Invention

The present invention relates to an optical device including a multilayer reflector.

2. Description of the Related Art (Vertical Cavity Surface Emitting Laser)

A vertical cavity surface emitting laser (VCSEL) which is an optical device can emit light in a direction perpendicular to a semiconductor substrate, so a two-dimensional array can be easily formed. When parallel processing of multibeam emitted from the two-dimensional array is performed, higher density and higher speed can be obtained, so various industrial applications are expected. For example, when a vertical cavity surface emitting laser array is used as an exposure source of an electrophotographic printer, the printing speed can be increased by parallel processing of a printing process using the multibeam.

A vertical cavity surface emitting laser which is currently in practical use is a device for mainly generating laser light of an infrared region (0.75 µm to 0.85 µm). A beam spot can be further reduced as an oscillation wavelength is shortened from the infrared region to a red region, a blue region, and an ultraviolet region, so higher resolution can be obtained. Therefore, the practical use of a vertical cavity surface emitting laser in the regions from red to ultraviolet is required.

There is a great effect attained by a combination of the increase in resolution which is obtained by the shortened wavelength and the parallel processing using the multibeam. Its contribution to various fields including applications for a printer is expected. When a vertical cavity surface emitting laser capable of oscillating in a band of from 1.3 µm to 1.5 µm in which dispersion or absorption in an optical fiber is small can be in practical use, long-distance large-capacity communications can be performed using an arrayed fiber and an arrayed optical source.

(Multilayer Reflector)

The feature of the vertical cavity surface emitting laser is to include a cavity provided in a direction perpendicular to an in-plane direction of a substrate. In order to realize a surface-emitting laser which can continuously operate at a room temperature, a reflector whose reflectivity is 99% or more is necessary.

An example of such a reflector to be used includes a multilayer reflector in which two materials whose refractive indices are different from each other are alternately laminated plural times by an optical thickness of $\lambda/4$. Here, $\lambda$ denotes a wavelength of light emitted from an optical device. The optical thickness is obtained by multiplying a thickness of a layer by a refractive index of a material of the layer.

(Near-Infrared Vertical Cavity Surface Emitting Laser)

For a near-infrared vertical cavity surface emitting laser using a GaAs semiconductor which is already in a practical use, a semiconductor multilayer mirror in which GaAs and AlAs which have extremely high crystallinity are combined is used. In addition, a semiconductor multilayer mirror in which AlGaAs whose Al composition is small and AlGaAs whose Al composition is large are combined for constituent layers is used.

However, a long-wavelength (1.3 µm to 1.5 µm) laser for communication and a red (0.62 µm to 0.7 µm) laser have a problem in that their thermal characteristics are undesirable or high-power output is difficult to be achieved.

That is, in an active layer for generating light of the communication wavelength region or the red region, there is no clad layer material capable of sufficiently confining electrons in the active layer at a high temperature ranging from 60° C. to 80° C. Therefore, with an increase in temperature, a large number of electrons are overflowing from the active layer, so the thermal characteristics deteriorate and the high-power output is difficult to perform.

In the vertical cavity surface emitting laser, heat generated by the active layer is confined to the vicinities of the active layer by the semiconductor multilayer reflector whose thermal resistance is high.

Therefore, unfortunately, the vertical cavity surface emitting lasers using the material for generating the light of the above-mentioned wavelength are devices whose temperature characteristics are undesirable.

To be specific, a normal multilayer reflector of the long-wavelength vertical cavity surface emitting laser has a structure in which an InGaAsP layer (high refractive index layer) whose optical thickness is $\lambda/4$ and an InP layer (low refractive index layer) whose optical thickness is $\lambda/4$ are alternately laminated as a large number of pairs. In this case, the thermal resistance of the InGaAsP layer used as the high refractive index layer is approximately 20 times larger than the thermal resistance of the InP layer used as the low refractive index layer.

In the circumstances, in 47th Seiken Symposium Preprints, pp. 80-81, March 2006 (Precision and Intelligence Laboratory, Tokyo Institute of Technology), a multilayer reflector in which the optical thickness of a multilayer reflector constituent layer is not set to $\lambda/4$ is discussed.

To be specific, with respect to the multilayer reflector of the long-wavelength vertical cavity surface emitting laser, in 47th Seiken Symposium Preprints, pp. 80-81, March 2006 (Precision and Intelligence Laboratory, Tokyo Institute of Technology), a multilayer reflector in which the optical thickness of an InP layer whose thermal resistance is small is set to a value larger than $\lambda/4$ and the optical thickness of an InGaAsP layer whose thermal resistance is large is set to a value smaller than $\lambda/4$ is disclosed in order to reduce the thermal resistance.

The total layer thickness (one pair) of the high refractive index layer and the low refractive index layer which constitute the multilayer reflector is fixed to be an optical thickness of $\lambda/2$. Therefore, it is considered that a heat dissipation effect can be improved and thus it is possible to provide the multilayer reflector in which an increase in device temperature can be prevented.

(Ultraviolet/Blue Vertical Cavity Surface Emitting Laser)

A GaN semiconductor material is used for a vertical cavity surface emitting laser in an ultraviolet/blue region (300 µm to 500 µm). For a multilayer reflector, for example, a pair including a GaN material and an AlN material with a relatively large refractive index difference therebetween is selected.

However, the multilayer reflector made of both of these materials has a large lattice mismatch. When several ten pairs are grown by an optical thickness of $\lambda/4$, it is more likely to introduce lattice strains into the multilayer by the lattice mismatch. As a result, a crack occurs, so it is difficult to form such a multilayer reflector as to achieve a reflectance of 99% or more.

Therefore, also in Japanese Patent Application Laid-Open No. 2003-107241, a multilayer reflector in which the optical thickness of constituent layers of the multilayer reflector is not set to $\lambda/4$ is discussed.

To be specific, a multilayer reflector is disclosed in which the optical thickness of a GaN layer whose thermal expansion coefficient difference with respect to a substrate is small is set to a value larger than $\lambda/4$ and the optical thickness of a $Al_{0.6}Ga_{0.4}N$ layer whose thermal expansion coefficient difference with respect to the substrate is large is set to a value smaller than $\lambda/4$.

The total optical thickness (of one pair) of the high refractive index layer and the low refractive index layer which constitute the multilayer reflector is fixed to be an optical thickness of $\lambda/2$. Therefore, it is considered that the multilayer reflector with few cracks can be provided.

In 47th Seiken Symposium Preprints, pp. 80-81, March 2006 (Precision and Intelligence Laboratory, Tokyo Institute of Technology) and Japanese Patent Application Laid-Open No. 2003-107241, the multilayer reflector including a layer whose optical thickness is not $\lambda/4$ is described. However, a design guideline for actually incorporating the multilayer reflector into a cavity is not described therein.

The inventor of the present invention arranged the layers whose optical thickness is not $\lambda/4$ as described in 47th Seiken Symposium Preprints, pp. 80-81, March 2006 (Precision and Intelligence Laboratory, Tokyo Institute of Technology) and studied in view of a cavity structure. As a result, it was found that the arrangement causes a deviation of a design value from a resonance wavelength and a reduction in reflectivity.

That is, when the arrangement of the high refractive index layer and the low refractive index layer with respect to the internal optical intensity distribution is not taken into account, it is likely to cause a reduction in yield due to the deviation of the resonance frequency or deterioration of device characteristics due to a reduction in reflectivity. As a result, although the intended use of the layer whose optical thickness is not $\lambda/4$ is made for improving the characteristics, a problem that the effect of such use cannot be obtained occurs.

SUMMARY OF THE INVENTION

The present invention has been made to solve the above-mentioned problem and an object of the present invention is to provide an optical device including a reflector having a layer whose optical thickness is not $\lambda/4$, for which the resonance wavelength is made closer to a design value and a reduction in reflectivity is suppressed.

According to the present invention, there is provided an optical device for generating light of a wavelength $\lambda$, including a reflector and an active layer, the reflector being a semiconductor multilayer reflector including a first layer and a second layer which are alternatively laminated and have refractive indices different from each other, wherein the first layer has an optical thickness smaller than $\lambda/4$ and the second layer has an optical thickness larger than $\lambda/4$, and an interface between the first layer and the second layer is located at a position other than a node and an antinode of an optical intensity distribution within the reflector.

According to the present invention, with respect to the optical device including the reflector having the layer whose optical thickness is not $\lambda/4$, the resonance wavelength can be made closer to the design value and the reduction in reflectivity can be suppressed.

Further features of the present invention will become apparent from the following description of exemplary embodiments with reference to the attached drawings.

BRIEF DESCRIPTION OF THE DRAWINGS

FIG. 5 illustrates a comparison between center wavelengths and reflectances in cases where only the multilayer reflector as illustrated in FIGS. 6A to 6D is taken into account.

FIG. 7 illustrates a comparison between center wavelengths and reflectances in cases where a resonator including the multilayer reflector and the active layer illustrated in FIGS. 4A to 4D is taken into account.

FIGS. 10A, 10B, 100 and 10D are enlarged schematic views illustrating resonator structures each including an AlN/GaN multilayer reflector and an InGaN quantum well active layer as illustrated in FIG. 9.

FIG. 11 illustrates a comparison between center wavelengths and reflectances in cases where only the multilayer reflector as illustrated in FIGS. 12A to 12D is taken into account.

FIG. 13 illustrates a comparison between center wavelengths and reflectances in cases where a resonator including the multilayer reflector and the active layer illustrated in FIGS. 10A to 10D is taken into account.

DESCRIPTION OF THE EMBODIMENTS

Embodiments of the present invention will be described with reference to FIG. 1 and FIGS. 2A to 2D.

Figure 1:
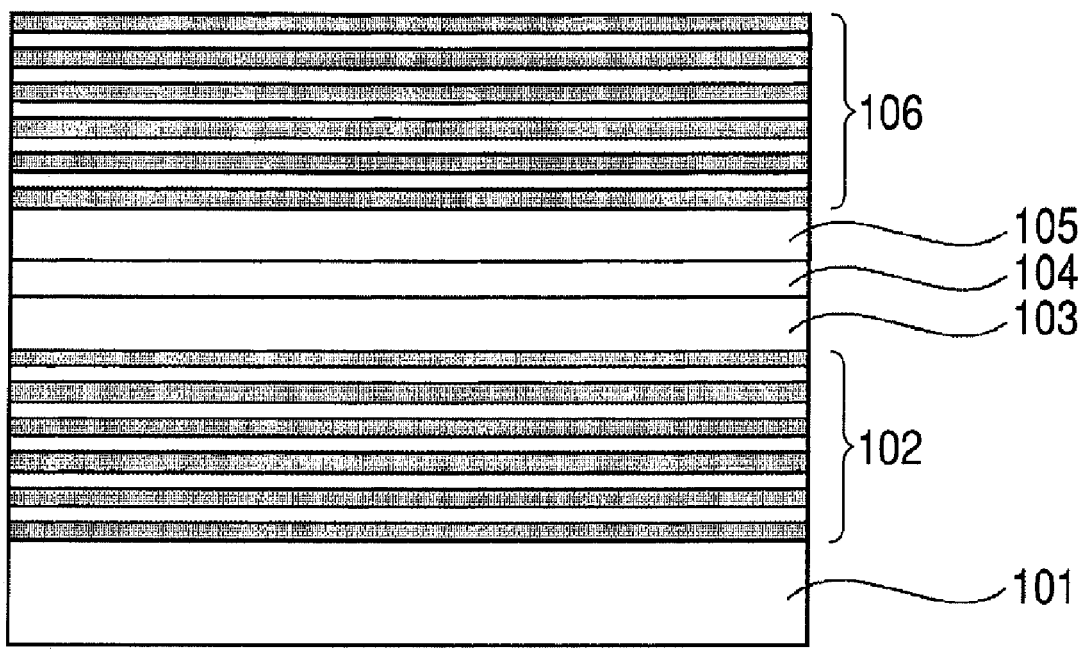
FIG. 1 is a schematic cross sectional view illustrating a structure of a vertical cavity surface emitting laser according to an embodiment of the present invention.

FIG. 1 is a schematic cross sectional view illustrating a structure of an optical device according to an embodiment of the present invention. Here, an example of a vertical cavity surface emitting laser will be described. A multilayer reflector 102, a spacer layer 103, an active layer 104, a spacer layer 105, and a multilayer reflector 106 are provided on a substrate 101.

Figure 2:
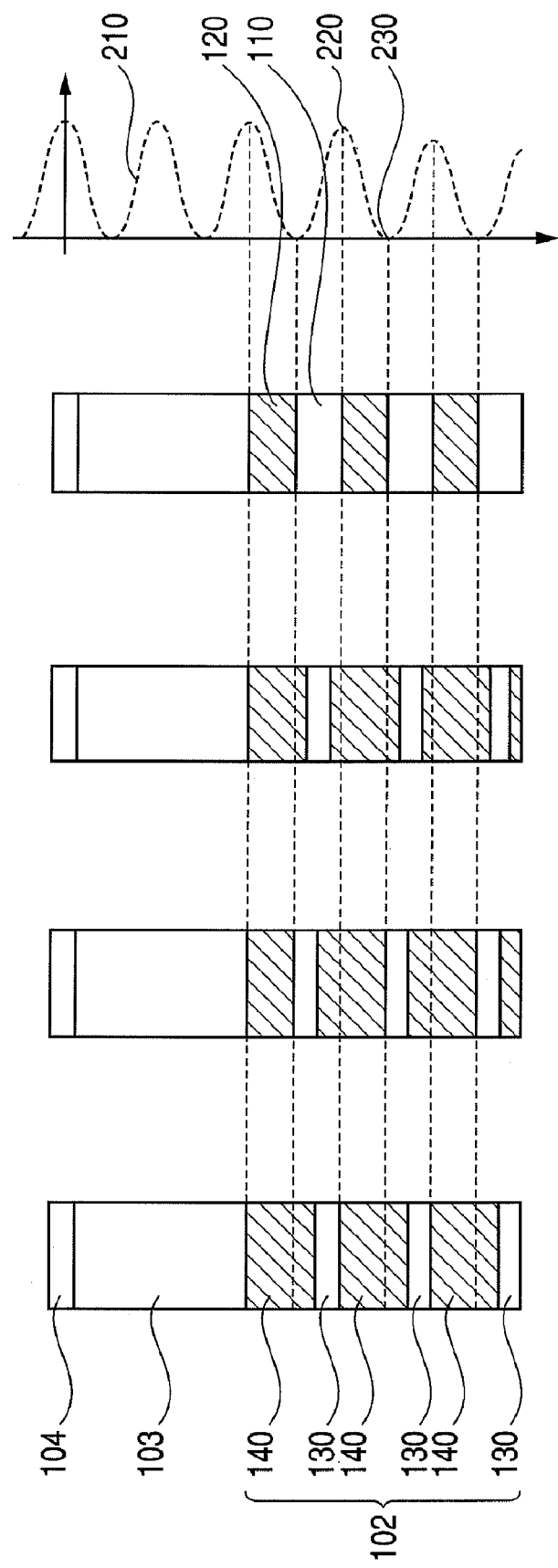
FIGS. 2A, 2B, 2C, and 2D are enlarged schematic views illustrating resonator structures of the vertical cavity surface emitting laser of FIG. 1.

FIGS. 2A to 2D are enlarged schematic views illustrating the multilayer reflector 102, the spacer layer 103, and the active layer 104 shown in FIG. 1. In the case of the multilayer reflector 102, only three pairs located close to the active layer 104 are illustrated for the sake of convenience. FIGS. 2A and 2B illustrate reference examples, FIG. 2C illustrates an embodiment of the present invention, and FIG. 2D illustrates a conventional example.

A. Structure of Conventional Example

In the conventional example shown in FIG. 2D, a multilayer reflector in which the optical thicknesses of both layers are $\lambda/4$ is constructed with conventional design values. As illustrated in FIG. 2D, the multilayer reflector 102 includes a layer 110 and a layer 120 which are alternately laminated. The layer 120 has a refractive index different from the refractive index of the layer 110. It is only required that the layers 110 and 120 have different refractive indexes from each other, so the refractive index of the layer 110 may be higher or lower than the refractive index of the layer 120. FIG. 2D illustrates the case where the refractive index of the layer 120 is lower than the refractive index of the layer 110.

B. Structures of Reference Examples

In the reference examples of FIGS. 2A and 2B, a multilayer reflector in which the optical thicknesses of both layers deviate from $\lambda/4$ is constructed. As illustrated in FIGS. 2A and 2B, the multilayer reflector includes a first layer 130 and a second layer 140 which are alternately laminated. It is only required that the first layer 130 and the second layer 140 have different refractive indexes, so the refractive index of the first layer 130 may be higher or lower than the refractive index of the second layer 140.

Unlike the structure of the conventional example, in the reference examples, the optical thickness of the first layer 130 is smaller than $\lambda/4$ and the optical thickness of the second layer 140 is larger than $\lambda/4$.

The optical thickness is obtained by multiplying a thickness of a layer by a refractive index of a material of the layer. For example, assume that the film thickness of the first layer 130 is expressed by $d_A$, the refractive index thereof is expressed by $n_A$, the film thickness of the second layer 140 is expressed by $d_B$, and the refractive index thereof is expressed by $n_B$. Then, the optical thickness of the first layer 130 is expressed by $d_A n_A$ and the optical thickness of the second layer 140 is expressed by $d_B n_B$.

The optical thickness of the first layer 130 and the optical thickness of the second layer 140 can be set as appropriate. For example, the optical thickness of the first layer 130 can be set to $\lambda/8$ or less and the optical thickness of the second layer 140 can be set to $3\lambda/8$ or more. Alternatively, the optical thickness of the first layer 130 can be set to $\lambda/16$ or less and the optical thickness of the second layer 140 can be set to $7\lambda/16$ or more.

In order to obtain a resonance wavelength as designed, it is desirable to set the sum of the optical thickness of the first layer 130 and the optical thickness of the second layer 140 to $\lambda/2$.

An internal optical intensity distribution 210 of the multilayer reflector are illustrated on the right side of FIG. 2D. The internal optical intensity distribution 210 includes an antinode 220 and a node 230.

As illustrated in FIG. 2A, one interface located between the first layer 130 and the second layer 140 corresponds to the antinode 220 of the optical intensity distribution. As illustrated in FIG. 2B, one interface located between the first layer 130 and the second layer 140 corresponds to the node 230 of the optical intensity distribution.

C. Structure of this Embodiment

As in the reference example, in this embodiment, it is only required that the first layer 130 and the second layer 140 have different refractive indices, so the refractive index of the first layer 130 may be higher than or lower than the refractive index of the second layer 140. The optical thickness of the first layer 130 is smaller than $\lambda/4$ and the optical thickness of the second layer 140 is larger than $\lambda/4$.

However, as illustrated in FIG. 2C, in the embodiment of the present invention, the interfaces between the first layer 130 and the second layer 140 correspond to neither the antinode 220 nor the node 230 of the optical intensity distribution.

Starting from the conventional example of FIG. 2D, when the thicknesses of both layers which constitute a multilayer reflector are changed, the interface between the layers is normally arranged so as to correspond to an antinode of the optical intensity distribution or a node thereof as illustrated in FIG. 2A or 2B. Even in the case of 47th Seiken Symposium Preprints, pp. 80-81, March 2006 (Precision and Intelligence Laboratory, Tokyo Institute of Technology), a method based on FIG. 2A or 2B is employed.

However, as illustrated in FIG. 2C, the feature of the embodiment of the present invention is to employ the structure in which the interface between the layers is arranged corresponding to neither the antinode nor the node of the optical intensity distribution.

When such a structure is employed, the resonance wavelength closer to the design value can be obtained and a reduction in reflectivity can be suppressed.

A material of the first layer 130 whose optical thickness is small and a material of the second layer 140 whose optical thickness is large can be selected as appropriate depending on purposes. Hereinafter, application examples to a long-wavelength laser and a short-wavelength laser will be described.

(Application to Long-Wavelength Laser)

As described above, a long-wavelength (1.3 µm to 1.5 µm) laser used for communication and a red (0.62 µm to 0.7 µm) laser have a problem in that their thermal characteristics are undesirable or high-power output is difficult to obtain. The vertical cavity surface emitting laser has a problem in that heat generated by an active layer is confined to the vicinities of the active layer by a semiconductor multilayer reflector whose thermal resistance is high.

To be specific, when an $Al_{0.5}Ga_{0.5}As$ layer and an AlAs layer being a binary system material are used respectively as a high refractive index layer and a low refractive index layer of a multilayer reflector for a red vertical cavity surface emitting laser, the thermal resistance of the $Al_{0.5}Ga_{0.5}As$ layer is eight times or more larger than the thermal resistance of the AlAs layer.

Therefore, as will be described in Example 1, in the case of the multilayer reflector of the red vertical cavity surface emitting laser, the optical thickness of the AlGaAs layer whose thermal resistance is large can be set smaller than $\lambda/4$ (first layer 130) and the optical thickness of the AlAs layer whose thermal resistance is small can be set larger than $\lambda/4$ (second layer 140).

In the case of the multilayer reflector of the long-wavelength vertical cavity surface emitting laser, the optical thickness of the InGaAsP layer whose thermal resistance is large can be set smaller than $\lambda/4$ (first layer 130) and the optical thickness of the InP layer whose thermal resistance is small can be set larger than $\lambda/4$ (second layer 140).

(Application to Short-Wavelength Laser)

A GaN semiconductor material is used for a vertical cavity surface emitting laser in an ultraviolet/blue region (300 μm to 500 μm). This short-wavelength laser has a problem in that there is no suitable material capable of making a lattice match with a layer serving as a base in epitaxial growth (for example, substrate) while employing a large refractive index difference between the low refractive index layer and the high refractive index layer.

Therefore, the optical thickness of a layer whose lattice mismatch is small can be set larger than $\lambda/4$ and the optical thickness of a layer whose lattice mismatch is large can be set smaller than $\lambda/4$. Thus, it is possible to provide a multilayer reflector in which high reflectance can be realized while the risk of causing a crack is suppressed.

For example, when GaN, GaN, and AlN are used for the substrate, the high refractive index layer, and the low refractive index layer, respectively, the lattice mismatch between GaN of the substrate and AlN of the low refractive index layer is large.

Therefore, as will be described in Example 2, in the case of the multilayer reflector of the short-wavelength vertical cavity surface emitting laser, the optical thickness of the AlN layer whose lattice mismatch with the substrate is large but whose refractive index difference with respect to the high refractive index layer is increased can be set smaller than $\lambda/4$. The optical thickness of the GaN layer which has a small lattice mismatch with the substrate and is used as the high refractive index layer can be set larger than $\lambda/4$.

In view of thermal expansion coefficients, the optical thickness of the AlGaN layer whose thermal expansion coefficient difference with respect to the substrate is large can be set smaller than $\lambda/4$ and the optical thickness of the GaN layer whose thermal expansion coefficient difference with respect to the substrate is small can be set larger than $\lambda/4$.

Another Embodiment

The number of pairs of the first layer 130 and the second layer 140 which are laminated is desirably two or more. When the number of laminated pairs increases, the reflectance of the multilayer reflector becomes higher. When the refractive index difference between the first layer 130 and the second layer 140 increases, the reflectivity of the multilayer reflector becomes higher.

The optical device according to the present invention can be used for various optical devices including not only the vertical cavity surface emitting laser but also a light-emitting diode and an optical function device. For example, when the number of pairs of the multilayer reflector in the present invention reduces, the optical device according to the present invention can be used as a light-emitting diode.

According to the present invention, an upper and lower multilayer reflectors are not necessarily provided. The present invention also includes an optical device having at least one single multilayer reflector.

The optical device according to the present invention can be suitably used as a light source of an electrophotographic recording process image forming apparatus.

EXAMPLE

Example 1

AlAs/AlGaAs

In Example 1, a vertical cavity surface emitting laser including a multilayer reflector which is used as a multilayer reflector for a red vertical cavity surface emitting laser and is made of an AlAs material and an AlGaAs material will be described. This multilayer reflector is constructed to reduce a thermal resistance.

Figure 3:
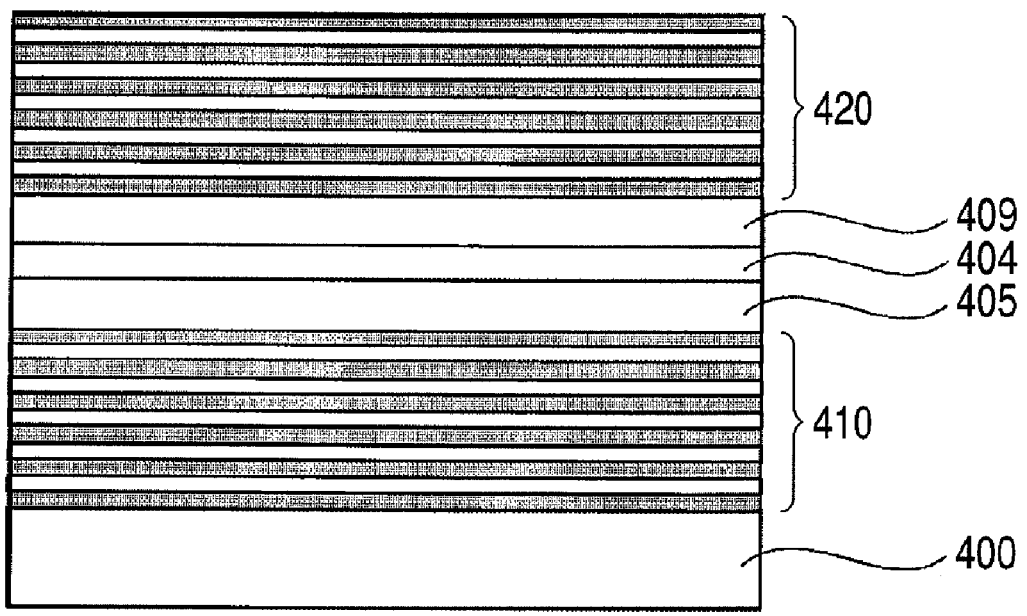
FIG. 3 is a schematic cross sectional view illustrating a structure of a vertical cavity surface emitting laser according to Example 1.

FIG. 3 is a schematic cross sectional view illustrating a structure of the vertical cavity surface emitting laser according to Example 1.

In this example, the vertical cavity surface emitting laser includes a GaAs substrate 400, an n-type AlAs/Al$_{0.5}$Ga$_{0.5}$As multilayer reflector 410, an n-type Al$_{0.5}$Ga$_{0.15}$In$_{0.5}$P spacer layer 405, a Ga$_{0.5}$In$_{0.5}$P/Al$_{0.25}$Ga$_{0.25}$In$_{0.5}$P quantum well active layer 404, a P-type Al$_{0.35}$Ga$_{0.15}$In$_{0.5}$P spacer layer 409, and a p-type Al$_{0.9}$Ga$_{0.1}$As/Al$_{0.5}$Ga$_{0.5}$As multilayer reflector 420.

The Ga$_{0.5}$In$_{0.5}$P/Al$_{0.25}$Ga$_{0.25}$In$_{0.5}$P quantum well active layer 404 used here includes, for example, four Ga$_{0.5}$In$_{0.5}$P well layers and has a light emission wavelength $\lambda$ of 650 nm to 690 nm.

The thickness of the n-type Al$_{0.35}$Ga$_{0.15}$In$_{0.5}$P spacer layer 405 and the thickness of the P-type Al$_{0.35}$Ga$_{0.15}$In$_{0.5}$P spacer layer 409 are adjusted to use an optical thickness of one wavelength as a cavity length. If necessary, the light emission wavelength, the number of wells, or the cavity length can be adjusted.

The p-type Al$_{0.9}$Ga$_{0.1}$As/Al$_{0.5}$Ga$_{0.5}$As multilayer reflector 420 is formed such that each optical thickness is $\lambda/4$ as in a conventional design. In order to reduce electrical resistance, a composition gradient layer of approximately 20 nm may be provided between the Al$_{0.9}$Ga$_{0.1}$As layer and the Al$_{0.5}$Ga$_{0.5}$As layer. Even in this case, the multilayer reflector 420 is formed such that the optical thickness of the layers including the composition gradient layer is $\lambda/4$.

In contrast to this, in order to reduce thermal resistance of the n-type AlAs/Al$_{0.5}$Ga$_{0.5}$As multilayer reflector 410, the optical thicknesses of the two constituent layers thereof are not $\lambda/4$. The optical thickness of the AlAs layer whose thermal resistance is small is set larger than $\lambda/4$ and the optical thickness of the Al$_{0.5}$Ga$_{0.5}$As layer whose thermal resistance is large is set smaller than $\lambda/4$.

In this example, the optical thickness of the AlAs layer is set to $3\lambda/8$ and the optical thickness of the Al$_{0.5}$Ga$_{0.5}$As layer is set to $\lambda/8$. Note that the sum of the layer thickness of the layers is maintained at an optical thickness of $\lambda/2$ in order to prevent the resonance wavelength from shifting.

(Cavity Structure)

Hereinafter, a method of incorporating the multilayer reflector in which film thicknesses are modulated into a cavity structure will be described.

FIGS. 4A to 4D are schematic enlarged views illustrating the AlAs/Al$_{0.5}$Ga$_{0.5}$As multilayer reflector 410, the Ga$_{0.5}$In$_{0.5}$P/Al$_{0.25}$Ga$_{0.25}$In$_{0.5}$P quantum well active layer 404, and the Al$_{0.35}$Ga$_{0.15}$In$_{0.5}$P spacer layer 405 shown in FIG. 3.

FIGS. 4A to 4D illustrate an internal optical intensity distribution 210, an antinode 220 of the internal optical intensity distribution 210, a node 230 of the internal optical intensity distribution 210, an AlAs layer 406, and an $Al_{0.5}Ga_{0.5}As$ layer 407. For simplicity, only three pairs in the multilayer reflector are illustrated in FIGS. 4A to 4D. The AlAs layer 406 is a low refractive index layer and the $Al_{0.5}Ga_{0.5}As$ layer 407 is a high refractive index layer.

In this example, the optical thickness of the $Al_{0.5}Ga_{0.5}As$ layer 407 whose thermal resistance is large is set to $\lambda/8$ to obtain a thin film and the optical thickness of the AlAs layer 406 whose thermal resistance is small is set to $3\lambda/8$ to obtain a thick film.

Hereinafter, the following respective cases of FIGS. 4A to 4D will be discussed based on the arrangement of the thickened AlAs layer 406 and the thinned $Al_{0.5}Ga_{0.5}As$ layer 407.

Figure 4:
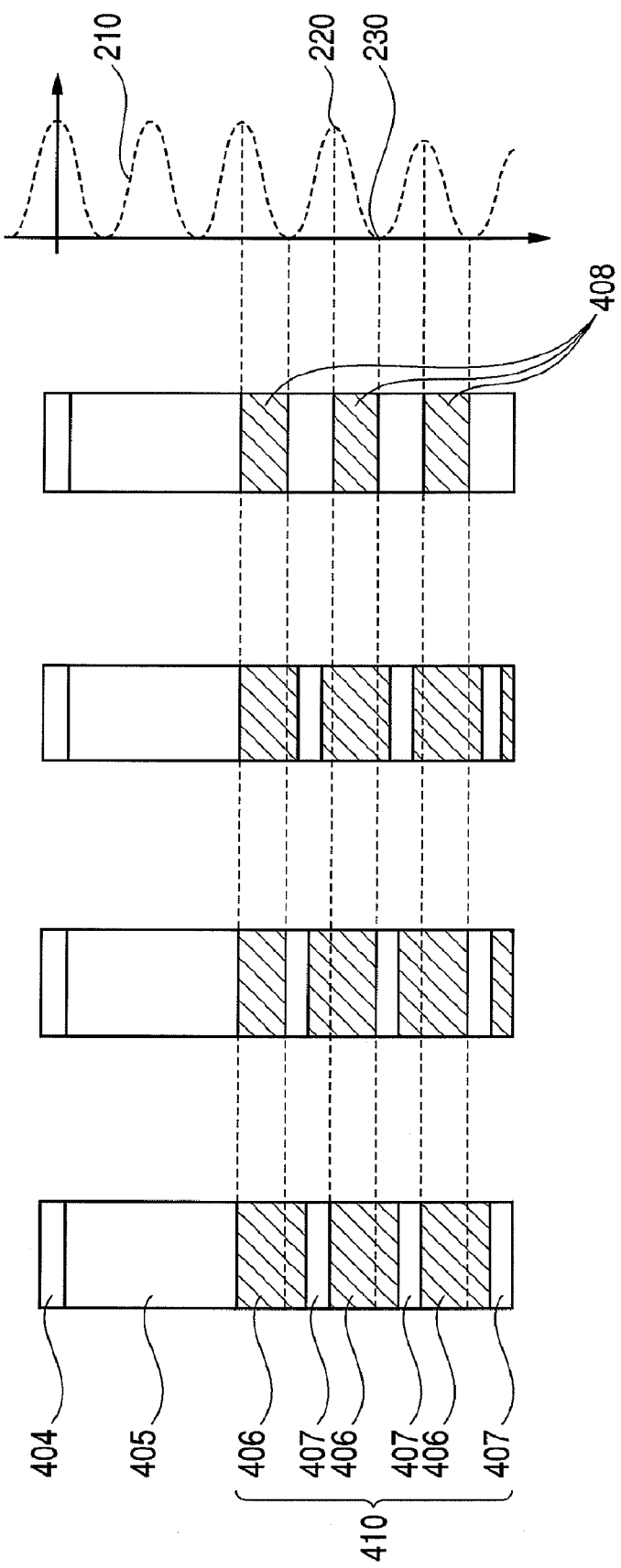
FIGS. 4A, 4B, 4C and 4D are enlarged schematic views illustrating resonator structures each including an AlAs/$Al_{0.5}Ga_{0.5}As$ multilayer reflector and a $Ga_{0.5}In_{0.5}P$ quantum well active layer as illustrated in FIGS. 2A to 2D.

FIGS. 4A and 4B illustrate reference examples. FIG. 4A indicates the case where the interface between the AlAs layer 406 and the $Al_{0.5}Ga_{0.5}As$ layer 407 is arranged so as to correspond to the antinode 220 of the optical intensity distribution and FIG. 4B indicates the case where the interface is arranged so as to correspond to the node 230 of the optical intensity distribution.

FIG. 4C illustrates Example 1 and the interface is located corresponding to neither an antinode nor a node of the optical intensity distribution. FIG. 4C indicates a more desirable example in which the center of the thickened AlAs layer 406 or the center of the thinned $Al_{0.5}Ga_{0.5}As$ layer 407 is located corresponding to just a midpoint between an antinode and a node, which are adjacent to each other, of the optical intensity distribution.

FIG. 4D illustrates a conventional example. For comparison with Example 1, the multilayer reflector is constructed with the optical thickness of $\lambda/4$ based on conventional design values. Note that, in this example, an $Al_{0.9}Ga_{0.1}As$ layer 408 is used as a low refractive index layers instead of the AlAs layer 406.

(Reflectivity and Resonance Wavelength)

FIG. 5 illustrates a calculation result of the reflectivity and the center wavelength of the reflection stop band for each of the above-mentioned multilayer reflectors. They are designed such that the center wavelength of the reflection stop band becomes 670 nm. The reflectivity in a direction indicated by each arrow is calculated based on the assumption that there is only a lower reflector as illustrated in FIGS. 6A to 6D. Assume that a conventional multilayer reflector serving as a comparison example, which is designed with the optical thickness of $\lambda/4$, has 70 pairs of layers. In order to obtain a reflectance substantially equal to the reflectance of the conventional multilayer reflector, pairs of layers are further added to provide 76 pairs of layers in total in each of the cases of FIGS. 6A, 6B, and 6C.

Figure 6:
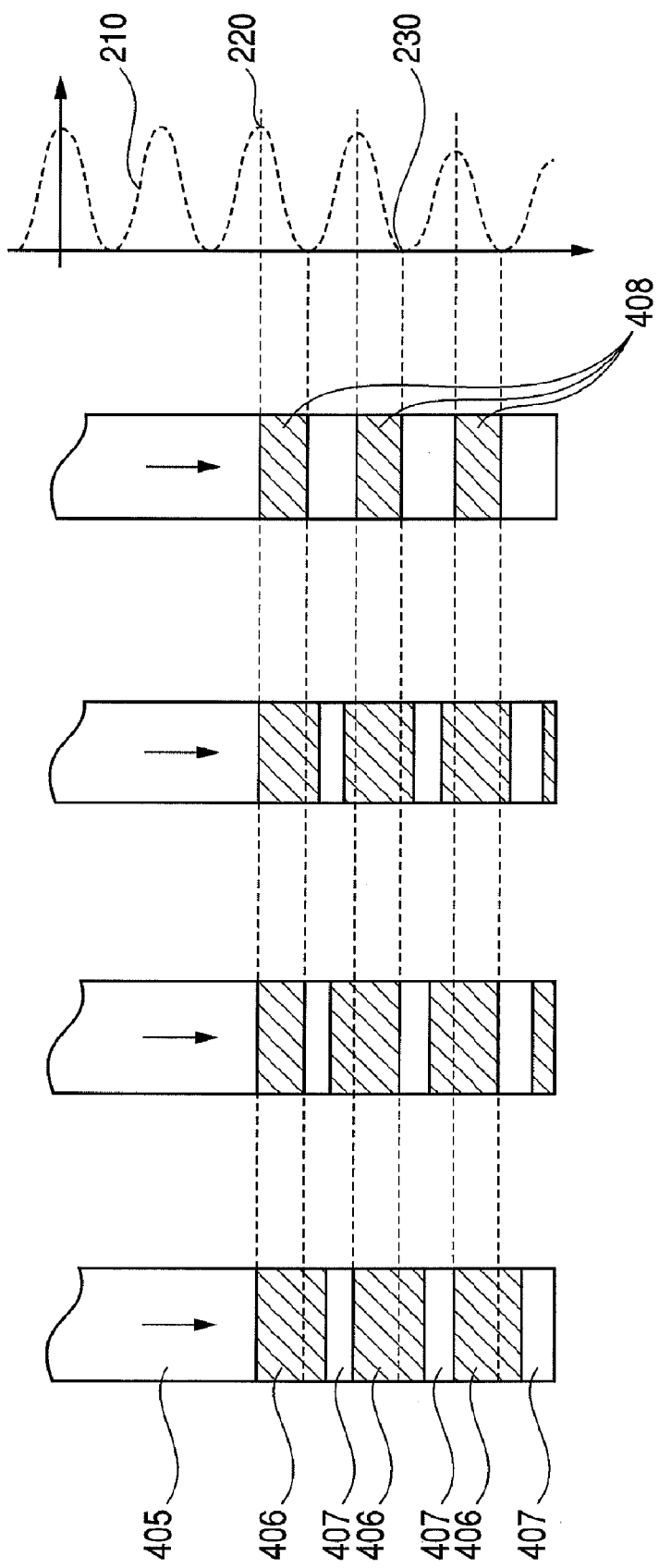
FIGS. 6A, 6B, 6C and 6D are enlarged schematic views illustrating structures in which only the AlAs/$Al_{0.5}Ga_{0.5}As$ multilayer reflector is taken into account.

As is apparent from the table of FIG. 5, when only the multilayer reflector is taken into account, substantially the same reflectance (99.997%) and substantially the same center wavelength (670 nm) are obtained in FIGS. 6A, 6B, and 6C irrespective of the arrangement of the thin film layers or the thick film layers. That is, even when the optical thickness deviates from $\lambda/4$, the positions of the thinned or thickened layers in the calculation performed in view of only the reflector do not cause a problem.

Next, FIG. 7 illustrates a calculation result of the resonance wavelength and the reflectance at the wavelength in the case where the cavity structure is incorporated, that is, in the case of each of FIGS. 4A to 4D. In the case of the conventional multilayer reflector designed with the optical thickness of $\lambda/4$, that is, in the case of FIG. 4D, the same result (670 nm, 99.997% or more) is obtained from both the calculation with respect to only the multilayer reflector and the calculation with respect to the cavity in which the multiple reflector is incorporated.

In contrast to this, it is apparent that the resonance wavelength in the case of FIG. 4A is shifted to longer wavelengths by approximately 8 nm and the resonance wavelength in the case of FIG. 4B is shifted to shorter wavelengths by approximately 8 nm. The reflectance is reduced to the order of 99.98%.

On the other hand, in the case of FIG. 4C, although the multilayer reflector is comprised of the layers whose optical thicknesses are not $\lambda/4$, the calculation result with respect to only the multilayer reflector and that with respect to the resonator in which the multiple reflector is incorporated are substantially equal to each other as in the conventional case of FIG. 4D.

That is, in the case of the multilayer reflector using layers whose optical thicknesses deviate from $\lambda/4$ as described above, unless not only the multilayer reflector but also the cavity in which the multilayer reflector is incorporated is taken into account, a deviation of the resonance wavelength or a reduction in reflectivity unexpectedly occurs. In the case where the structure in this example is employed, even when the optical thickness deviates from $\lambda/4$, the characteristics of the main body can be brought out without being damaged.

(Design Guide)

Next, a specific structure of FIG. 4C will be described.

Figure 8A:
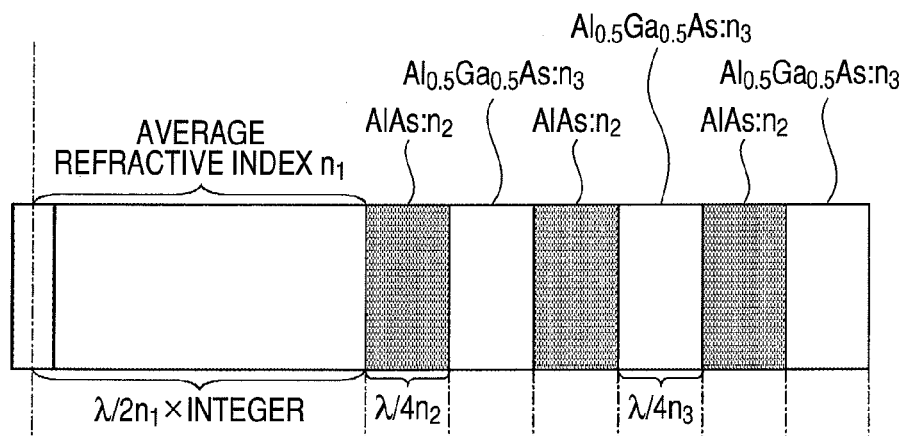
FIGS. 8A and 8B are schematic explanatory views illustrating a specific structure (FIG. 8B) of Example 1 in comparison with a conventional example (FIG. 8A).
Figure 8B:
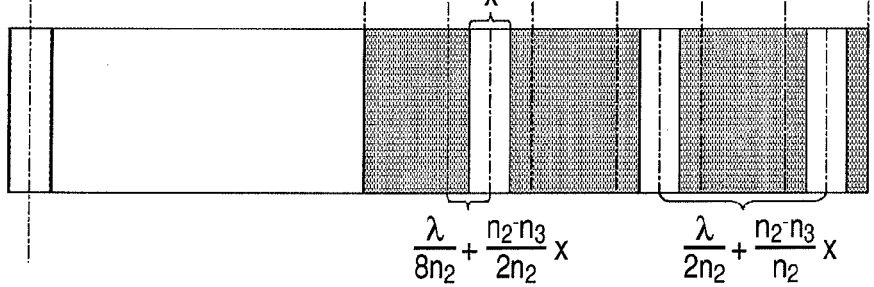

FIG. 8B illustrates the structure of FIG. 4C in this example and FIG. 8A illustrates the structure of FIG. 4D in the conventional example.

In FIGS. 8A and 8B, $\lambda$ denotes an oscillation wavelength of laser light and $n_1$ denotes an average refractive index of a medium located between an active layer and at least one of a first mirror and a second mirror. In addition, $n_2$ denotes a refractive index of a thickened layer whose optical thickness is larger than $\lambda/4$ (AlAs layer) and $n_3$ denotes a refractive index of a thinned layer whose optical thickness is smaller than $\lambda/4$ ($Al_{0.5}Ga_{0.5}As$ layer). The optical thickness of the thinned $Al_{0.5}Ga_{0.5}As$ layer becomes smaller than $\lambda/4$ ($\lambda/4n_3$) and is expressed here by x.

In this example, the $AlAs/Al_{0.5}Ga_{0.5}As$ multilayer reflector which is one of the multiple reflectors in the vertical cavity surface emitting laser is arranged as illustrated in FIG. 8B. That is, it is so arranged that the center of the $Al_{0.5}Ga_{0.5}As$ layer having a thickness of x is located at a distance, from the center of the active layer, of an integral multiple of $\lambda/2n_1$, $\lambda/4n_2$, and a distance defined by the following expression $$\frac{\lambda}{8n_2} + \frac{n_2 - n_3}{2n_2}x$$

and the $AlAs/Al_{0.5}Ga_{0.5}As$ layers are repeatedly provided at an interval defined by the following expression:

$$\frac{\lambda}{2n_2} + \frac{n_2 - n_3}{n_2} \cdot x$$

An example of the structure expressed by this expression includes a structure in which the layer thickness of the AlAs layer whose thermal conductivity is high is set to $3\lambda/8n_2$ and the layer thickness of the $Al_{0.5}Ga_{0.5}As$ layer whose thermal conductivity is low is set to $\lambda/8n_3$.

Example 2

AlN/GaN

Example 2 will be described. In Example 2, a vertical cavity surface emitting laser which includes a multilayer reflector having an AlN layer and a GaN layer and is used for emitting ultraviolet/blue light will be described. The reflector is constructed to improve a reflectance in view of refractive index difference and lattice mismatch.

Figure 9:
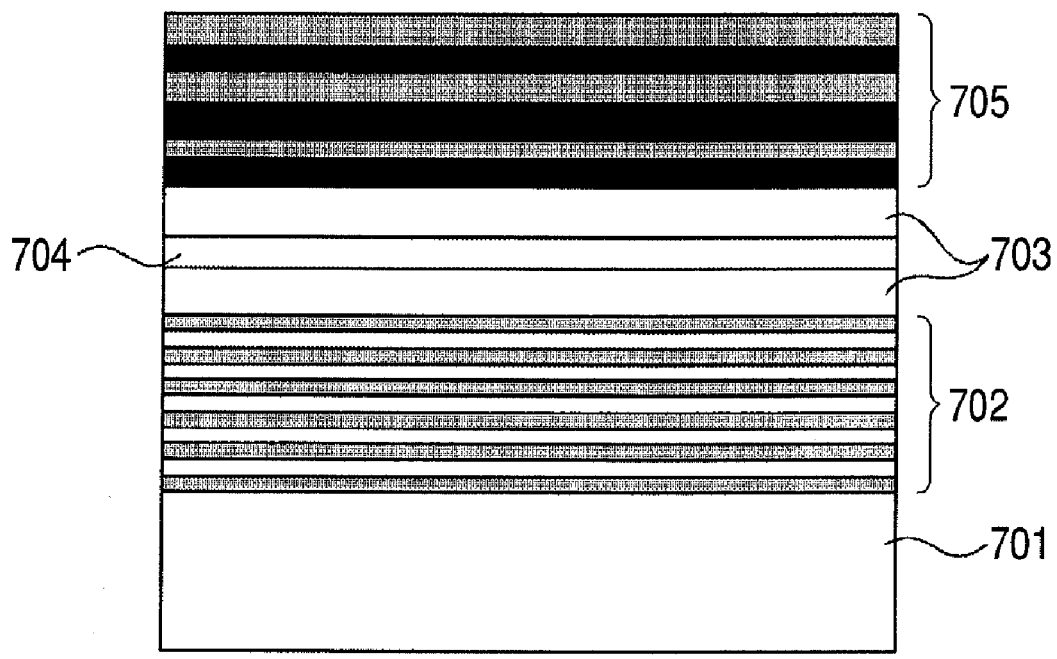
FIG. 9 is a schematic cross sectional view illustrating a structure of a vertical cavity surface emitting laser according to Example 2.

FIG. 9 is a schematic cross sectional view illustrating a structure of the vertical cavity surface emitting laser according to Example 2.

In this example, the vertical cavity surface emitting laser includes a GaN substrate 701, an AlN/GaN multilayer reflector 702, a GaN spacer layer 703, an InGaN quantum well active layer 704, and an $SiO_2/TiO_2$ multilayer reflector 705.

The InGaN quantum well active layer 704 used here includes, for example, four InGaN well layers and has a light emission wavelength of 390 nm to 410 nm. The optical thicknesses of the two GaN spacers 103 are adjusted to obtain a cavity length corresponding to 2 wavelengths. If necessary, the light emission wavelength, the number of wells, or the resonator length can be adjusted.

According to the conventional design method, the optical thickness of each of the AlN layer and the GaN layer which constitute the multiple reflector 702 is $\lambda/4$.

In contrast to this, according to this example, the GaN substrate is used, so the optical thickness of the AlN layer having a larger lattice mismatch is set to $\lambda/8$, the optical thickness of the GaN layer having little strain is set to $3\lambda/8$, and 24 pairs of the AlN layer and the GaN layer are laminated.

The $SiO_2/TiO_2$ multilayer reflector 705 includes eight pairs of layers which are laminated with the conventional layer thickness corresponding to the optical thickness of $\lambda/4$. Doping and electrode formation which are necessary for current injection are omitted here because of having no direct relation with the present invention. However, when doping and electrode formation are suitably performed, it is possible to provide a structure in which a current can be injected.

(Cavity Structure)

FIGS. 10A to 10D are schematic enlarged views illustrating a cavity structure including the AlN/GaN multilayer reflector 702 and the InGaN quantum well active layer 704 shown in FIG. 9.

FIGS. 10A to 10D illustrate an internal optical intensity distribution 210, an antinode 220 of the internal optical intensity distribution 210, a node 230 of the internal optical intensity distribution 210, an InGaN 704 quantum well, an AlN layer 805, and a GaN layer 806. For simplification, only three pairs in the multilayer reflector are illustrated in FIGS. 10A to 10D. The AlN layer 805 is a low refractive index layer and the GaN layer 806 is a high refractive index layer.

There is a large difference between a lattice constant of the substrate which is generally used for a group III nitride semiconductor laser or a lattice constant of a thickest group III nitride semiconductor layer serving as a base in epitaxial growth and a lattice constant of the AlN layer.

On the other hand, the AlN layer has a low refractive index, so a refractive index difference with respect to a high refractive index layer such as the GaN layer is large, thereby improving the reflectivity. Therefore, in this example, the optical thickness of the AlN layer whose lattice mismatch is large is set to $\lambda/8$ and the optical thickness of the GaN layer whose lattice mismatch is little is set to $3\lambda/8$.

Hereinafter, the following respective cases of FIGS. 10A to 10D will be discussed on the thinned AlN layer based on the arrangement thereof.

Figures 10A, 10B, 10C, 10D:
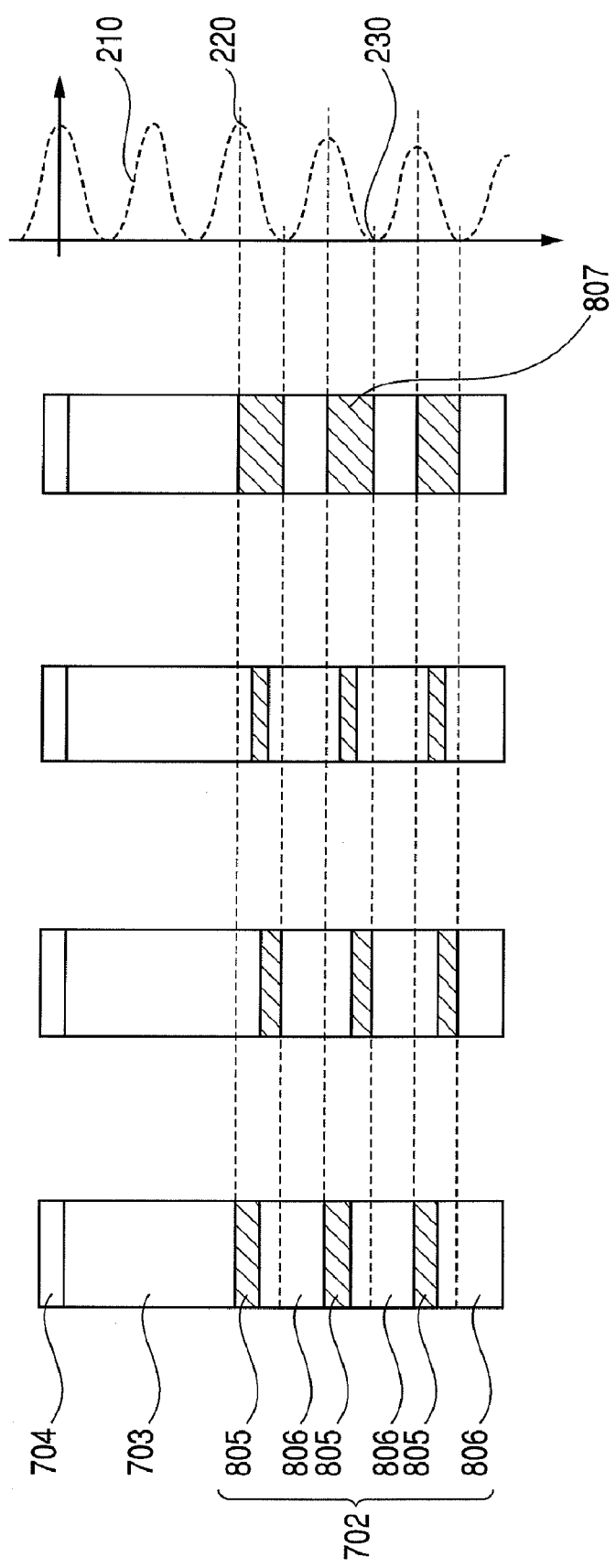

FIGS. 10A and 10B illustrate reference examples. FIG. 10A indicates the case where one GaN/AlN interface is located corresponding to the antinode 220 of the optical intensity distribution 210 and FIG. 10B indicates the case where one interface is located corresponding to the node 230 of the optical intensity distribution 210.

FIG. 10C illustrates Example 2 and the interface is located corresponding to neither the antinode nor the node of the optical intensity distribution. FIG. 10C indicates a more desirable example in which the center of the thinned AlN layer 805 is located corresponding to just a midpoint between an antinode and a node, which are adjacent to each other, of the optical intensity distribution.

FIG. 10D illustrates a conventional example. For comparison with Example 2, the multilayer reflector is constructed with the optical thickness of $\lambda/4$ based on conventional design values. Note that, in this example, an $Al_{0.5}Ga_{0.5}N$ layer 807 instead of the AlN layer 805 is used as a low refractive index layer.

In order to facilitate a relationship among the constituent layer interfaces and the antinodes/nodes of the internal optical intensity distribution, the intensity distribution is illustrated on the right side.

(Reflectivity and Resonance Wavelength)

FIG. 11 illustrates a calculation result of the reflectivity and the center wavelength of a reflection stop band in each of the above-mentioned multilayer reflectors. They are designed such that the center wavelength of the reflection stop band becomes 400 nm. The reflectance in a direction indicated by each arrow is calculated based on the assumption that there is only a lower reflector as illustrated in FIGS. 12A to 12D. In each of the cases of FIGS. 12A to 12D, 24 pairs of layers are provided.

Figure 12:
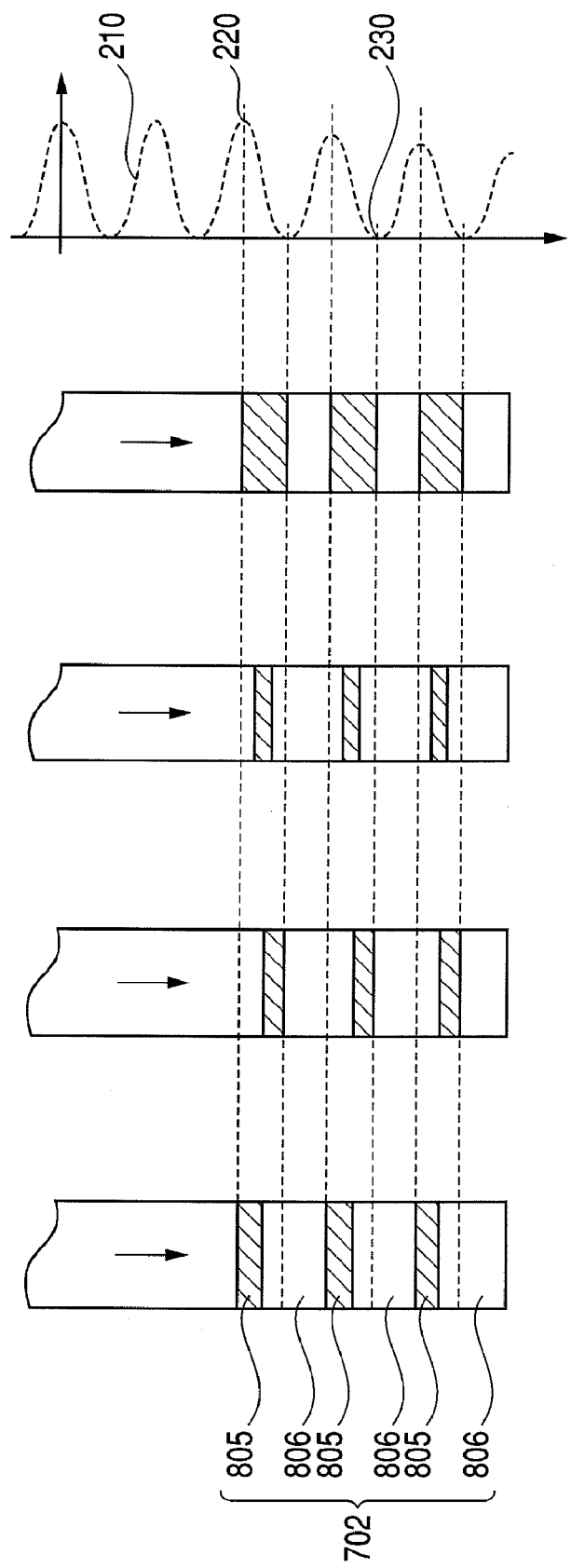
FIGS. 12A, 12B, 12C and 12D are enlarged schematic views illustrating structures in which only the AlN/GaN multilayer reflector is taken into account.

As is apparent from the table of FIG. 11, when only the multilayer reflector is taken into account, substantially the same reflectance (99.5%) and substantially the same center wavelength (400 nm) are obtained in FIGS. 12A, 12B, and 12C irrespective of the arrangement of the thin film layers or the thick film layers. That is, even when the optical thickness deviates from $\lambda/4$, the positions of the thinned layers in the calculation performed in view of only the reflector do not cause a problem.

Next, FIG. 13 illustrates a calculation result of the resonance wavelength and the reflectance in the case where the cavity is incorporated, that is, in the case of each of FIGS. 10A to 10D. In the case of the conventional multilayer reflector designed with the optical thickness of $\lambda/4$, that is, in the case of FIG. 10D, the same result (400 nm, 99.12%) is obtained from both the calculation with respect to only the multilayer reflector and the calculation with respect to the cavity in which the multiple reflector is incorporated.

In contrast to this, in a case of FIGS. 10A and 10B, it is apparent that the resonance wavelength in the case of FIG. 10A is shifted to shorter wavelengths and the resonance wavelength in the case of FIG. 10B is shifted to longer wavelengths by approximately 9 nm to 10 nm, respectively. The reflectivity is reduced to the order of 98%.

On the other hand, in the case of FIG. 10C, although the multilayer reflector is comprised of the layers whose optical thicknesses are not $\lambda/4$, a calculation result with respect to only the multilayer reflector and that with respect to the cavity in which the multiple reflector is incorporated are substantially equal to each other as in the conventional case of FIG.

10D, and reduction in a reflectivity and deviation of the resonance wavelength are not observed.

That is, in the case of the multilayer reflector using layers whose optical thicknesses deviate from λ/4 as described above, unless not only the multilayer reflector but also the cavity in which the multilayer reflector is incorporated is taken into account, a deviation of the resonance wavelength or a reduction in reflectivity unexpectedly occurs.

In the case where the structure in this example is employed, even when the optical thickness deviates from λ/4, the characteristics of the main body can be brought out without being damaged.

As described above, according to this example, a group III nitride semiconductor multilayer reflector whose reflectivity is high and crack is small in number can be easily manufactured, and the vertical cavity surface emitting laser using the multilayer reflector can be realized.

(Design Guide)

Next, a specific structure of FIG. 10C in this example will be further described.

Figure 14A:
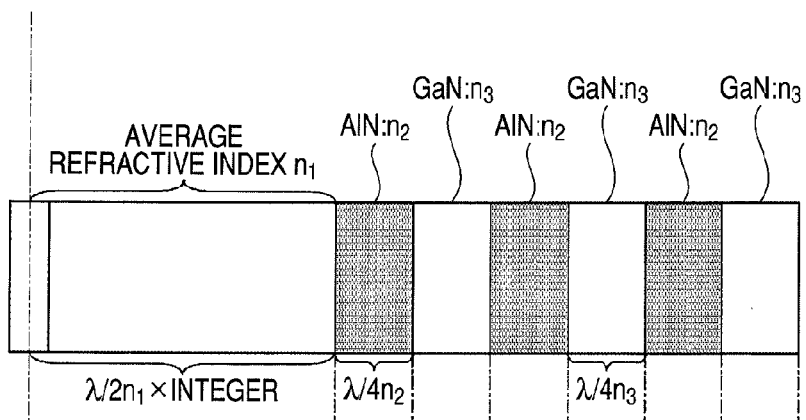
FIGS. 14A and 14B are schematic explanatory views illustrating a specific structure (FIG. 14B) of Example 2 in comparison with a conventional example (FIG. 14A).
Figure 14B:
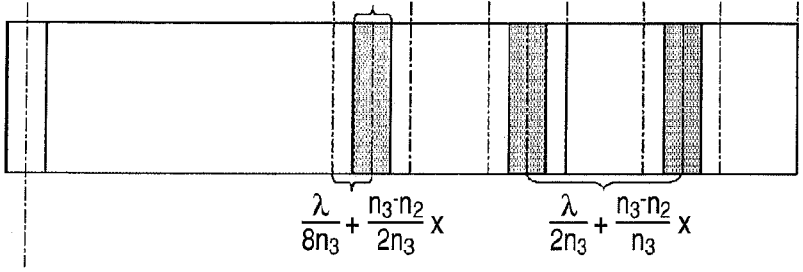

FIG. 14B illustrates the structure of FIG. 100 in this example and FIG. 14A illustrates the structure of FIG. 10D in the conventional example.

In FIGS. 14A and 14B, λ denotes an oscillation wavelength of laser light and $n_1$ denotes an average refractive index of a medium located between an active layer and at least one of the first mirror and the second mirror.

In addition, $n_2$ denotes a refractive index of a group III nitride semiconductor layer whose lattice mismatch with respect to the substrate is larger (AlN layer) and $n_3$ denotes a refractive index of a group III nitride semiconductor layer whose lattice mismatch with respect to the substrate is smaller (GaN layer). The optical thickness of the AlN layer whose lattice mismatch is larger is smaller than $\lambda/4(\lambda/4n_2)$ and is expressed here by x.

In this example, the AlN/GaN multilayer reflector which is one of the multiple reflectors in the vertical cavity surface emitting laser is arranged as illustrated in FIG. 14. That is, it is so arranged that the center of the AlN layer having a thickness of x which is smaller than $\lambda/4n_2$ is located at a distance, from the center of the active layer, of an integral multiple of $\lambda/2n_1$ and a distance defined by the following expression $$\frac{\lambda}{8n_3} + \frac{n_3 - n_2}{2n_3}x$$

and the AlN/GaN layers are repeatedly provided at an interval defined by the following expression:

$$\frac{\lambda}{2n_3} + \frac{n_3 - n_2}{n_3}x$$

An example of the structure expressed by this expression includes a structure in which a semiconductor layer with larger lattice mismatch is used as the AlN layer with a layer thickness of $\lambda/8n_2$ and a semiconductor layer with smaller lattice mismatch is used as the GaN layer with a layer thickness of $3\lambda/8n_3$.

Example 3

AlN/GaN

Example 3 will be described. In Example 3, a vertical cavity surface emitting laser will be described in which a substrate (sapphire) different from the substrate in Example 2 is used and multilayer reflectors are formed above and below an active layer using different film thicknesses.

Figure 15:
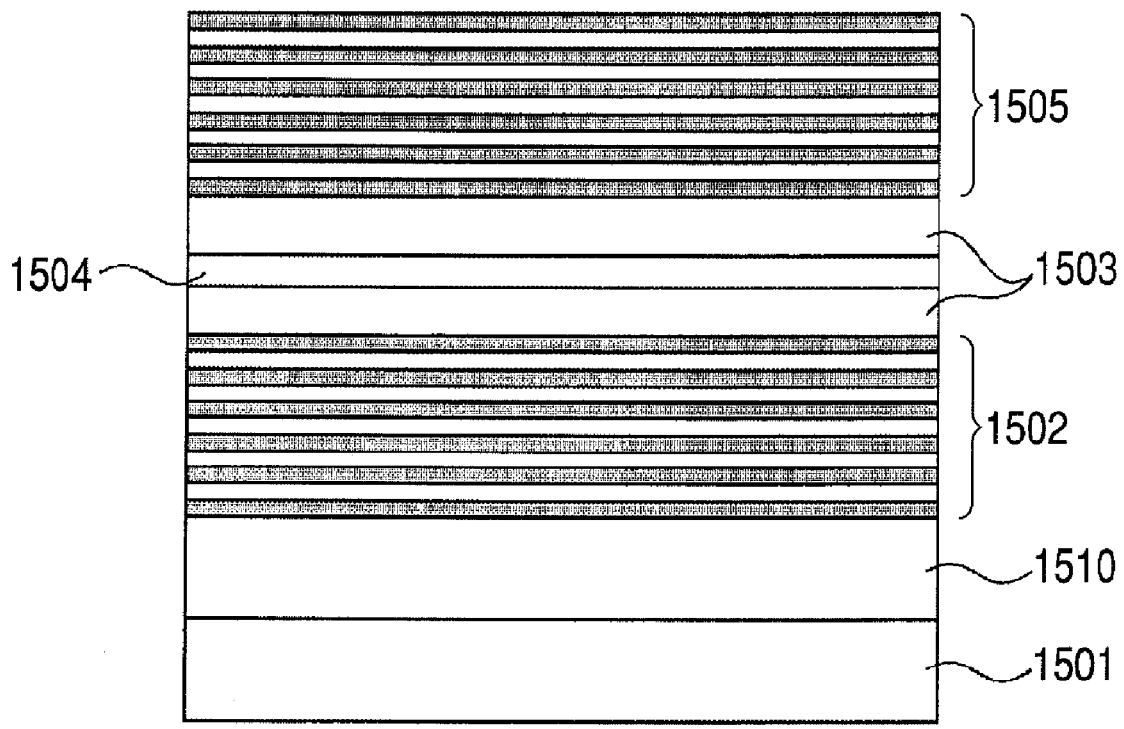
FIG. 15 is a schematic cross sectional view illustrating a structure of a vertical cavity surface emitting laser according to Example 3.

FIG. 15 is a schematic cross sectional view illustrating a structure of the vertical cavity surface emitting laser according to this example.

In this example, the vertical cavity surface emitting laser includes a sapphire substrate 1501, a GaN thick film 1510, an AlN/GaN multilayer reflector 1502, a GaN spacer layer 1503, an InGaN quantum well active layer 1504, and an AlN/GaN multilayer reflector 1505.

For example, the InGaN multiple quantum well active layer used here is the same as in Example 2. Each of the multilayer reflectors 1502 and 1505 includes an AlN constituent layer and a GaN constituent layer. In this case, the growth of the constituent layers follows the epitaxial growth of the GaN thick film on the sapphire substrate.

Therefore, the optical thickness of the AlN layer having a larger lattice mismatch is set to λ/16 to obtain a thin film, the optical thickness of the GaN layer having little strain is set to 7λ/16 to obtain a thick film, and 52 pairs of the AlN layer and the GaN layer are laminated.

Doping and electrode formation which are necessary for current injection are omitted here because of having no direct relation with the present invention. However, when doping and electrode formation are suitably performed, it is possible to provide a structure in which a current can be injected.

Figure 16:
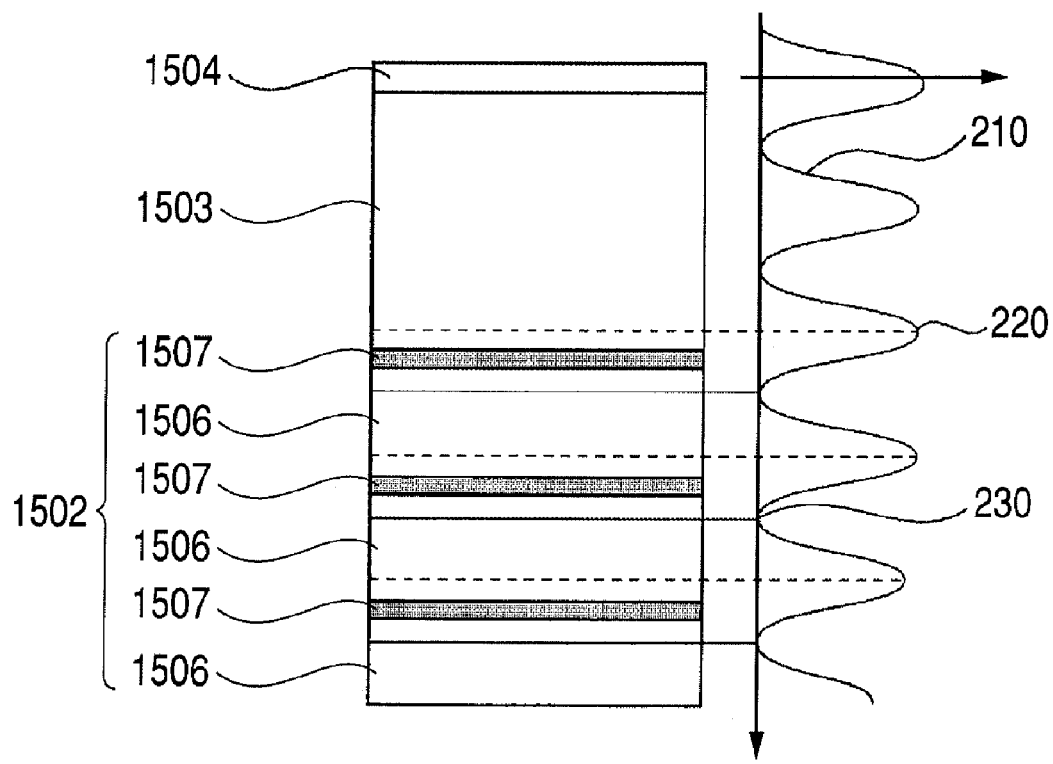
FIG. 16 is an enlarged schematic view illustrating a resonator structure including an AlN/GaN multilayer reflector and an InGaN quantum well active layer as illustrated in FIG. 15.

FIG. 16 is a schematic enlarged view illustrating a cavity structure including the AlN/GaN multilayer reflector 1502 and the InGaN quantum well active layer 1504 as illustrated in FIG. 15.

For simplification, only three pairs included in the multilayer reflector are illustrated in FIG. 16. As in Example 2, the interfaces are located corresponding to neither the antinode 220 nor the node 230 of the optical intensity distribution 210 within the multilayer reflector.

FIG. 16 indicates a more desirable example. A thinned AlN layer 1507 is arranged such that the center of the thinned AlN layer 1507 is located corresponding to a midpoint between a node and an antinode, which are adjacent to each other, of the optical intensity distribution.

The thickened GaN layer 1506 is provided between the adjacent AlN layers 1507. Even in this case, a reflectance of 99% or more is obtained, so a high reflectance which may be required for continuous oscillation at room temperature can be realized.

The layer thickness per one multilayer reflector in this example is substantially two times the layer thickness per one multilayer reflector in Example 2. However, accumulated strain amounts in both the examples are substantially equal to each other. Therefore, the multilayer reflector is resistant to cracks.

As described above, according to this example, the layer thickness to be reduced and the number of pairs can be more desirably selected in response to other requirements.

Example 4

AlN/GaN

Example 4 will be described. In Example 4, a vertical cavity surface emitting laser in which a multilayer reflector is formed using a substrate (AlN) different from the substrate used in Example 2 or 3 will be described. Also, this example is different from Examples 2 and 3 in that the optical thickness of the AlN layer is thicker than the optical thickness of the GaN layer.

Figure 17:
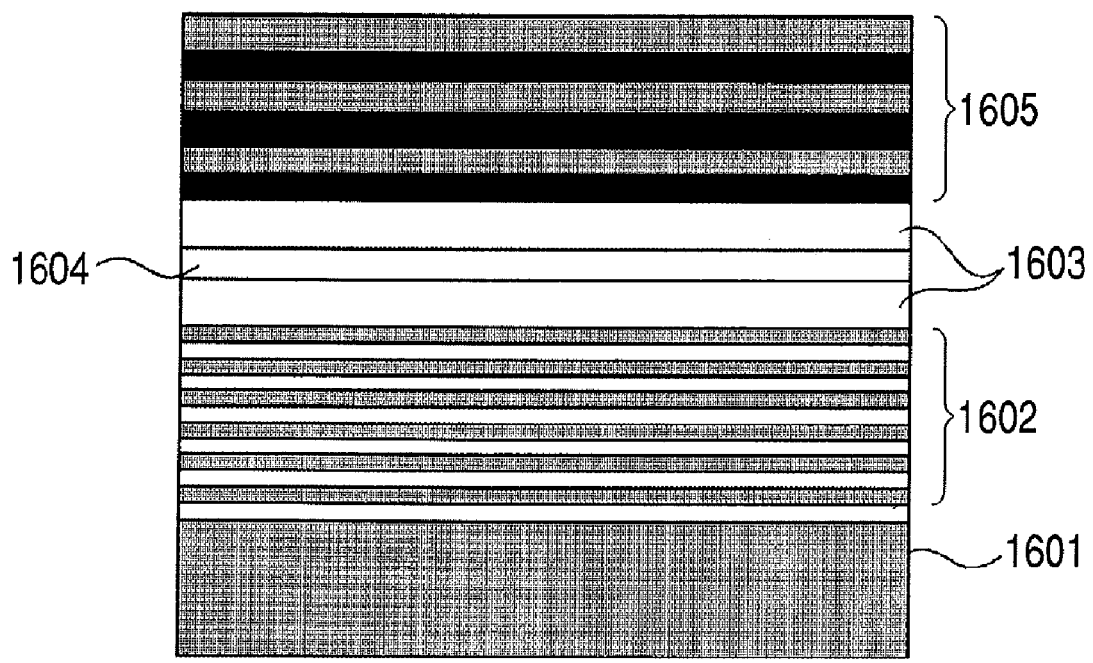
FIG. 17 is a schematic cross sectional view illustrating a structure of a vertical cavity surface emitting laser according to Example 4.

FIG. 17 is a schematic cross sectional view illustrating a structure of the vertical cavity surface emitting laser according to this example.

In this example, the vertical cavity surface emitting laser includes an AlN substrate 1601, an AlN/GaN multilayer reflector 1602, a GaN spacer layer 1603, an InGaN quantum well active layer 1604, and an SiO2/TiO2 multilayer reflector 1605.

The InGaN quantum well active layer 1604 and the SiO2/TiO2 multilayer reflector 1605 which are used here are the same as in Example 2.

The AlN/GaN multilayer reflector 1602 includes an AlN constituent layer and a GaN constituent layer. In this case, the constituent layers are formed on the AlN substrate 1601 by epitaxial growth.

Therefore, the optical thickness of the GaN layer having a larger lattice mismatch is set to $\lambda/8$ to obtain a thin film, the optical thickness of the AlN layer having little strain is set to $3\lambda/8$ to obtain a thick film, and 27 pairs of the GaN layer and the AlN layer are laminated.

Doping and electrode formation which are necessary for current injection are omitted here because of having no direct relation with the present invention. However, when doping and electrode formation are suitably performed, it is possible to provide a structure in which a current can be injected.

Figure 18:
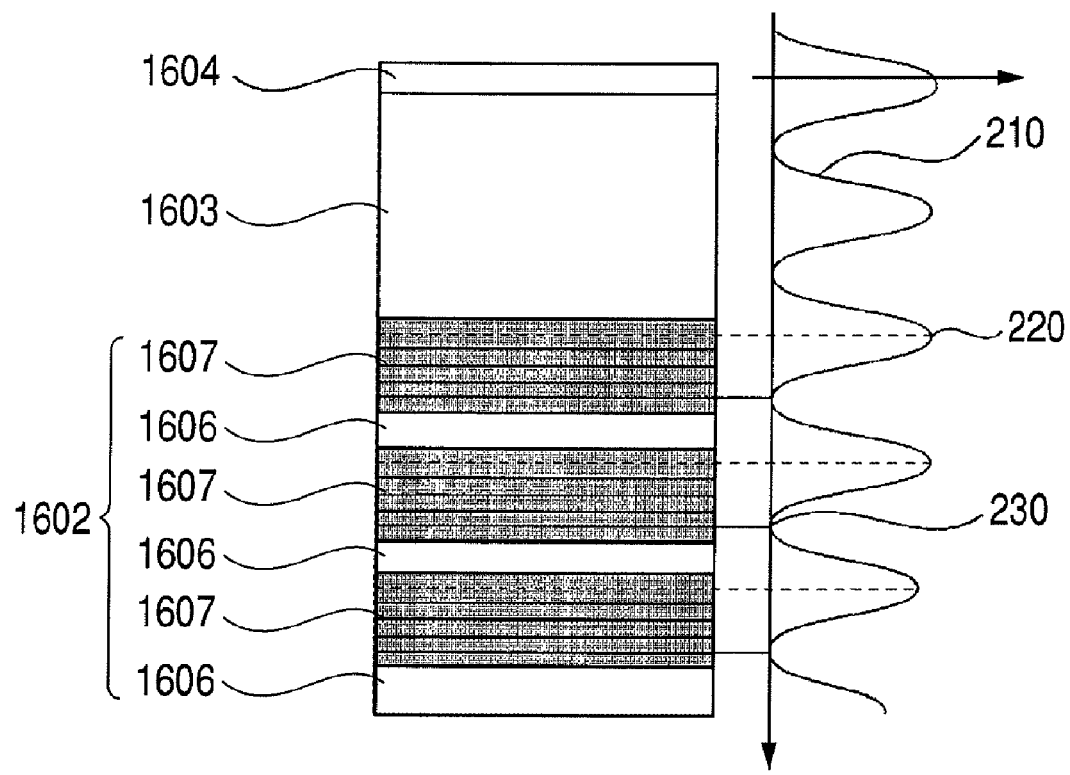
FIG. 18 is an enlarged schematic view illustrating a resonator structure including an AlN/GaN multilayer reflector and an InGaN quantum well active layer as illustrated in FIG. 17.

FIG. 18 is a schematic enlarged view illustrating a cavity structure including the AlN/GaN multilayer reflector 1602 and the InGaN quantum well active layer 1604 as illustrated in FIG. 17.

For simplification, only three pairs in the multilayer reflector are illustrated in FIG. 18.

As in Examples 2 and 3, constituent layer interfaces are located corresponding to neither the antinode 220 nor the node 230 of the optical intensity distribution 210 within the multilayer reflector. FIG. 18 indicates a more desirable example. The multilayer reflector is formed such that the center of the thinned GaN layer 1606 is located corresponding to a midpoint between a node and an antinode, which are adjacent to each other, of the optical intensity distribution.

Even in this case, a reflectivity of 99% or more is obtained, so a high reflectivity which may be required for continuous oscillation at room temperature can be realized.

As described above, according to this embodiment, a layer to be thinned can be determined based on the type of a substrate to be used and the degree of lattice mismatch caused thereby to the constituent layers of the multilayer reflector, to realize both a reduction of cracks and an increase in reflectivity.

Example 5

Image Forming Apparatus

Example 5 of the present invention will be described. In Example 5, an example in which the optical device according to the present invention is used as a light source of an electrophotographic apparatus will be described.

The electrophotographic apparatus includes a photosensitive member, a charging unit for charging the photosensitive member, a light beam emitting unit for emitting a light beam for forming an electrostatic latent image to the charged photosensitive member, and a developing unit for developing the electrostatic latent image formed by the emitted light beam.

Figure 19:
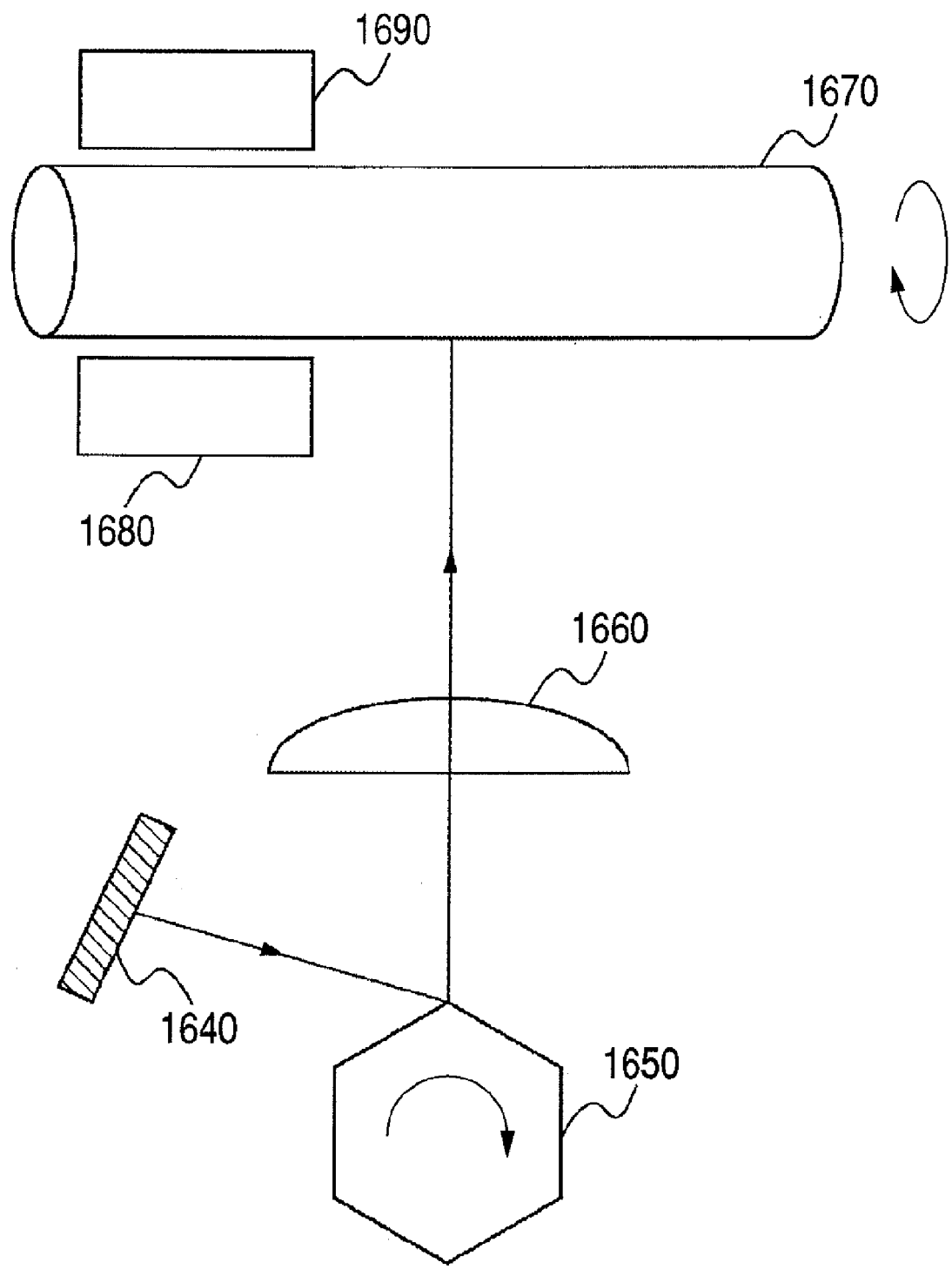
FIG. 19 is a schematic explanatory view illustrating an electrophotographic apparatus using an optical device according to the present invention.

Hereinafter, an image forming process performed by the electrophotographic apparatus will be described with reference to FIG. 19.

A photosensitive member 1670 is uniformly charged by a charging unit 1690. Laser light is emitted from an optical device 1640 according to the present invention which is an exposure light source to the photosensitive member 1670 through a polygon mirror 1650 which is an optical path changing unit and a condensing lens 1660. When the laser light is emitted to the photosensitive member 1670, charges are removed from an irradiated portion of the photosensitive member 1670 to form an electrostatic latent image. Toner is supplied by a developing unit 1680 onto the photosensitive member 1670 in which the electrostatic latent image is formed, thereby forming a toner image. The toner image is transferred to a transferring material such as a paper.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-229100, filed Aug. 25, 2006, and No. 2007-137949, filed May 24, 2007, which are hereby incorporated by reference herein in their entirety.

What is claimed is:

1. An optical device for generating light of a wavelength $\lambda$, comprising:
   a multilayer reflector including a first layer having an optical thickness of $(\lambda/4-t)$ and a second layer having an optical thickness of $(\lambda/4+t)$; and
   a cavity including a spacer layer and an active layer, and having an optical thickness of an integral multiple of $\lambda/2$,
   wherein the first layer has a lower refractive index than that of the second layer,
   wherein the layer of the multilayer that is closest to the cavity is the first layer, and a layer having an optical thickness of $t/2$ is provided between the multilayer reflector and the cavity.

2. An optical device according to claim 1, wherein two or more pairs of the first layer and the second layer are laminated.

3. An optical device according to claim 1, wherein a center of the first layer is located at a first position corresponding to a midpoint between a node and an antinode, which are adjacent to each other, of the optical intensity distribution within the reflector, and a center of the second layer is located at a second position corresponding to a midpoint between a node and an antinode, which are adjacent to each other, of the optical intensity distribution within the reflector.

4. An optical device according to claim 1, wherein the first layer has a thermal resistance smaller than a thermal resistance of the second layer.

5. An optical device according to claim 1, wherein the second layer comprises a binary material.

6. An optical device according to claim 5, wherein the first layer is an AlAs layer.

7. An optical device according to claim 1, wherein a difference between a lattice constant of a substrate of the optical device and a lattice constant of the second layer is smaller than a difference between the lattice constant of the substrate and a lattice constant of the first layer.

8. An optical device according to claim 7, wherein the first layer is an AlN layer.

9. An optical device according to claim 7, wherein the second layer is a GaN layer.

10. A vertical cavity surface emitting laser, comprising:
    a substrate; and
    two reflectors provided above the substrate, wherein at least one of the two reflectors comprises the optical device according to claim 1.

11. An optical device for generating light of a wavelength $\lambda$, comprising:
- a multilayer reflector including a first layer having an optical thickness of $(\lambda/4-t)$ and a second layer having an optical thickness of $(\lambda/4+t)$; and
- a cavity including a spacer layer and an active layer, and having an optical thickness of an integral multiple of $\lambda/2$,
- wherein the first layer has a higher refractive index than that of the second layer,
- wherein the layer of the multilayer that is closest to the cavity is the first layer, and a layer having an optical thickness of $(\lambda/4+t/2)$ is provided between the multilayer reflector and the cavity.

12. An optical device according to claim 11, wherein two or more pairs of the first layer and the second layer are laminated.

13. An optical device according to claim 11, wherein a center of the first layer is located at a first position corresponding to a midpoint between a node and an antinode, which are adjacent to each other, of the optical intensity distribution within the reflector, and a center of the second layer is located at a second position corresponding to a midpoint between a node and an antinode, which are adjacent to each other, of the optical intensity distribution within the reflector.

14. An optical device according to claim 11, wherein the first layer has a thermal resistance larger than a thermal resistance of the second layer.

15. An optical device according to claim 14, wherein the second layer comprises a binary material.

16. An optical device according to claim 15, wherein the second layer is an AlAs layer.

17. An optical device according to claim 1, wherein a difference between a lattice constant of a substrate of the optical device and a lattice constant of the second layer is larger than a difference between the lattice constant of the substrate and a lattice constant of the first layer.

18. A vertical cavity surface emitting laser, comprising:
- a substrate; and
- two reflectors provided above the substrate;
- wherein at least one of the two reflectors comprises the optical device according to claim 11.

* * * * *